United States Patent
Plank

(10) Patent No.: US 7,935,972 B2
(45) Date of Patent: May 3, 2011

(54) LIGHT EMISSION DEVICE

(75) Inventor: Wolfgang Plank, Rankweil (AT)

(73) Assignee: Ivoclar Vivadent AG, Schaan (LI)

( * ) Notice: Subject to any disclaimer, the term of this patent is extended or adjusted under 35 U.S.C. 154(b) by 89 days.

(21) Appl. No.: 12/075,474

(22) Filed: Mar. 11, 2008

(65) Prior Publication Data

US 2008/0217630 A1 Sep. 11, 2008

Related U.S. Application Data

(60) Provisional application No. 60/931,577, filed on May 24, 2007.

(30) Foreign Application Priority Data

Mar. 9, 2007 (DE) .......... 10 2007 011 637

(51) Int. Cl.
*H01L 33/00* (2010.01)

(52) U.S. Cl. ....... 257/89; 257/79; 257/88; 257/E25.019; 257/E25.021

(58) Field of Classification Search .......... 257/88, 257/89

See application file for complete search history.

(56) References Cited

U.S. PATENT DOCUMENTS

| | | | | |
|---|---|---|---|---|
| 5,739,552 | A * | 4/1998 | Kimura et al. | 257/89 |
| 6,030,700 | A * | 2/2000 | Forrest et al. | 428/336 |
| 6,358,631 | B1 * | 3/2002 | Forrest et al. | 428/690 |
| 7,110,061 | B2 * | 9/2006 | Komoto et al. | 349/61 |
| 2002/0153243 | A1 * | 10/2002 | Forrest et al. | 204/192.26 |
| 2003/0213967 | A1 * | 11/2003 | Forrest et al. | 257/96 |
| 2005/0238310 | A1 * | 10/2005 | Hoshi et al. | 385/129 |
| 2006/0158581 | A1 * | 7/2006 | Komoto et al. | 349/71 |
| 2007/0170444 | A1 * | 7/2007 | Cao | 257/89 |
| 2007/0228392 | A1 | 10/2007 | Plank | |
| 2009/0134409 | A1 * | 5/2009 | Wang et al. | 257/89 |

* cited by examiner

*Primary Examiner* — Leonardo Andújar
*Assistant Examiner* — William Harriston
(74) *Attorney, Agent, or Firm* — Ann M. Knab

(57) ABSTRACT

The invention relates to a light emission device, comprising at least two light-emitting semiconductor chips and a substrate. At least one first semiconductor chip (12) is fitted on the substrate and a second semiconductor chip (14) is fitted on the first semiconductor chip (12).

20 Claims, 3 Drawing Sheets

LIGHT EMISSION DEVICE

CROSS-REFERENCE TO RELATED APPLICATIONS

This application claims priority from U.S. provisional patent application Ser. No. 60/931,577 filed May 24, 2007.

TECHNICAL FIELD

The present invention relates to a light emission device, comprising at least two light-emitting semiconductor chips and a substrate, at least one first semiconductor chip is fitted on the substrate and a second semiconductor chip is fitted on the first semiconductor chip.

BACKGROUND OF THE INVENTION

Numerous attempts have been made to increase the emission intensity of light emitting diodes. It has thus been proposed to arrange a plurality of very small light emitting diode semiconductor chips closely adjacent to one another in order to attain a higher luminous efficiency. A problem in this case, of course, is the heat dissipation, since the closely adjacent arrangement of the semiconductor chips means that the latter become very hot at corresponding power.

It has therefore been attempted to separate the light emission from the thermal radiation if possible and to cause the thermal radiation to be radiated principally toward the rear and, by contrast, the light emission toward the front.

Such considerations also give rise to the so-called flip-chip technique, which involves fitting one or a plurality of semiconductor chips onto a light-transmissive substrate, which may be made of sapphire or the like, by way of example.

A reflector layer, for example made of silver, extends on that side of the chip or chips which is remote from the sapphire, both the contact-connection and the heat dissipation being effected by means of very thick posts, so-called bumps, which make contact with the chip in a suitable manner.

In the case of this solution, the intention is then for as much heat as possible to be dissipated toward the rear if possible, while light, amplified by the silver reflection layer, is intended to leave the light emission device through the sapphire substrate toward the front.

Endeavors have also been made for a relatively long time to increase the optical efficiency of light emission devices. For this purpose, combinations of converging lenses and reflectors are usually used, which concentrate the emitted light and are intended to reduce the generation of spurious light and scattered light.

It has recently been proposed, for example, in accordance with German Patent Application 10 2006 015 377 to form a semiconductor radiation source with a plurality of LED chips which are contact-connected by means of a printed circuit board brought up close, wherein a reflector in combination with a converging lens is intended to ensure a highest possible luminous efficiency, but the generated heat is nevertheless intended to be dissipated well.

Although a semiconductor radiation source of this type is basically already highly suitable if it is necessary to ensure a highest possible luminous efficiency, it would be desirable, however, to improve the luminous efficiency even further without increasing the emission of heat.

OBJECTS AND SUMMARY OF THE INVENTION

Therefore, the invention is based on the object of providing a light emission device which is improved with regard to the light emission without an increase in the electrical power giving rise to problems in the dissipation of heat.

According to the invention, it is particularly expedient that a centrally intensified light emission can be generated by the stacked arrangement of LED chips. The focusing of such a central point of brightness is significantly easier than in the case of a planar distribution of the light emission, with the result that the luminous efficiency can be significantly increased overall.

This opens up an extended field of application for light emission devices, for example also in dental technology, where correspondingly constructed light curing devices make it possible to rapidly polymerize in a targeted manner specific regions of a polymerizable dental restoration that have not yet fully cured sufficiently.

Surprisingly, the light emission can be significantly increased by the stacked fitting of chips, use being made of the fact that the chip itself is transmissive to light. The transmissivity is particularly good for the same materials used since then the same lattice constant is present there. The invention provides for forming a very thin and light-transmissive adhesive layer between the semiconductor chips of the chip stack, said adhesive layer also having good thermal conductivity and therefore dissipating the heat of the upper chips well.

According to the invention, it is also possible to make use of the fact that a significant part of the light emission in semiconductor chips typically takes place via lateral light exit areas. The latter are preferably arranged so as not to impair the light emission obliquely toward the front. This can be achieved for example by the stack of semiconductor chips having an essentially pyramidal construction. The respective upper semiconductor chips are set back in each case relative to the respective lower semiconductor chips, that is to say are offset inward toward the optical axis. This is accompanied by a reduction of the dimensions of the upper semiconductor chips relative to the respective lower semiconductor chip, the reduction preferably being effected in both directions.

In a manner known per se, the semiconductor chips may be square and formed essentially as thin laminae. Semiconductor chips having different dimensions are readily available, such that it is possible in this respect to have recourse to commercially available components which can be combined in a particularly favorable manner according to the invention.

In this case, it is also possible to make use of the fact that the semiconductor chips typically have a Lambertian radiating characteristic that makes it possible, precisely upon superposing a plurality of such radiating characteristics that are spaced apart somewhat from one another in the vertical direction, that is to say in the light emission direction, to increase the light emission in the region of the optical axis in relative terms.

According to the invention, it is thus possible to significantly increase the proportion of the directly radiated light with respect to the proportion of the reflected light, with the result that reflector faults and the like are also less important.

In an advantageous configuration of the invention it is provided that at least one upwardly facing area of a lower semiconductor chip is not covered by the semiconductor chip situated thereon and remains free in this respect. Said area serves on the one hand for light emission; on the other hand this provides the possibility of providing a connection area for bonding, such that per semiconductor chip at least two connection areas are available for the electrical supply of the semiconductor chips. According to the invention, it is provided that the lower area is formed in a suitable manner for the heat dissipation. For this purpose, the lower semiconductor chip is at least not smaller and preferably larger than the semiconductor chip situated above it. Insofar as the semiconductor chip situated above it extends partially beyond the semiconductor chip situated underneath, this is effected on a spatially limited scale, in which case the sum of the self-supporting areas of the upper semiconductor chip should preferably make up less than 20% and in particular less than 10% of the total area.

It goes without saying that here semiconductor chip should be understood to mean a die in which it is also possible to combine a plurality of electrical structures which can also be connected to a plurality of connection areas.

It is particularly favorable if a converging lens is fitted above the topmost semiconductor chip.

The emitted light radiation can thereby be focused in a suitable manner, it also being readily possible according to the invention for the emitted light to be conducted into an optical waveguide such as a light guiding rod.

According to the invention, it is preferred for the arrangement of the semiconductor chips to be free of reflectors and reflection layers, apart from a reflection layer arranged below the bottommost semiconductor chip. Said reflection layer reflects the downwardly emitted radiation essentially completely and has an effect upward, it being preferred for the semiconductor chip arrangement to be surrounded by a ring reflector by means of which the radiation reflected in this way is additionally projected toward the front and focused.

According to the invention it is also readily possible to configure the stacked semiconductor chips such that they emit light in different wavelength ranges. For this purpose, it is possible to make use of the fact that each semiconductor chip is provided with connection areas. The electrical driving can thus be effected independently of one another, such that color changes can also readily be realized.

According to the invention, in the case of the preferred pyramidal construction of the semiconductor chip arrangement, use is also made of the effect that the bottommost semiconductor chip exhibits the highest light emission and, accompanying this, evolution of heat. The heat arising there can be dissipated very well on account of the direct mounting onto a substrate having a thermal conductivity, while the quantity of heat introduced in the case of semiconductor chips arranged further up is also smaller according to the smaller dimensions of said chips.

Since a compact arrangement of semiconductor chips is possible according to the invention, it is preferred to provide the provision of free areas for bonding on a printed circuit board directly adjacent to the semiconductor chips. For this purpose, the substrate preferably has a projection on which the bottommost semiconductor chip is fitted and up to the lateral area of which the printed circuit board is brought with its free area.

It is favorable in this connection if the structural height of the printed circuit board essentially corresponds to the height of the substrate base projection.

In a further advantageous configuration it is provided that the second as relatively upper semiconductor chip leaves free an upwardly facing area of the first as relatively lower semiconductor chip, and that at least the left-free area of the lower semiconductor chip and at least one area of the upper semiconductor chip are light-emitting, the lower semiconductor chip being fitted on the substrate.

In a further advantageous configuration it is provided that lateral light emission areas extend laterally at the chips, which are offset with respect to one another.

In a further advantageous configuration it is provided that a lateral light emission area of the upper semiconductor chip extends, relative to a lateral light emission area of the lower semiconductor chip, in a manner shifted toward the center of the semiconductor chip.

In a further advantageous configuration it is provided that the semiconductor chips are constructed essentially pyramidally with respect to one another.

In a further advantageous configuration it is provided that the semiconductor chips are at least partly transmissive to emitted radiation.

In a further advantageous configuration it is provided that the light emission device has a reflector fitted below the lower semiconductor chip, and that no reflector is provided between the lower, a middle, and the upper semiconductor chip.

In a further advantageous configuration it is provided that the light emission device has a plurality of semiconductor chips and a reflector is fitted below the bottommost semiconductor chip, which extends in particular laterally beyond the semiconductor chip.

In a further advantageous configuration it is provided that the semiconductor chips are connected to one another by means of a reflection-free adhesive layer having a thermal conductivity having approximately the same magnitude as the thermal conductivity of the semiconductor chips, the thickness of the adhesive layer being less than 100 μm and preferably less than 50 μm.

In a further advantageous configuration it is provided that a plurality of semiconductor chips which emit light having different spectral wavelengths are arranged one on top of another.

In a further advantageous configuration it is provided that the semiconductor chips are at least partly electrically connected in series with one another.

In a further advantageous configuration it is provided that the semiconductor chips are at least partly electrically connected in parallel with one another.

In a further advantageous configuration it is provided that the semiconductor chips have at least one electrical connection zone on their top side in the region of the left-free area.

In a further advantageous configuration it is provided that the substrate is electrically insulating and carries a reflection layer.

In a further advantageous configuration it is provided that the bottommost semiconductor chip is applied to an electrically at least semiconducting substrate, and that an electrical connection area of the bottommost semiconductor chip is formed by the substrate.

In a further advantageous configuration it is provided that the upper semiconductor chip is smaller than the lower semiconductor chip, in particular the size difference corresponding approximately to twice the thickness of each semiconductor chip.

In a further advantageous configuration it is provided that semiconductor chips fitted one on top of another are rotated relative to one another, in particular at an angle of, in particular, 45°.

In a further advantageous configuration it is provided that the substrate has a projection, the dimensions of which essentially correspond to the dimensions of the lower semiconductor chip and on which the lower semiconductor chip is fitted.

In a further advantageous configuration it is provided that an additional reflector, in particular a ring reflector, surrounds the semiconductor chips fitted one on top of another, the orientation of which reflector is oblique or parabolic in a manner known per se and which reflector reflects the lateral light emission of the semiconductor chips toward the front.

In a further advantageous configuration it is provided that a converging lens is fitted before the semiconductor chips, said converging lens being supported in particular on the reflector.

In a further advantageous configuration it is provided that the space between the semiconductor chips and the underside of the converging lens is filled by a transparent or translucent, liquid or gel-type light-transmissive substance, in particular silicone gel.

In a further advantageous configuration it is provided that the electrical connection areas are adjacent to free areas of a printed circuit board, to which areas they are electrically connected by means of bonding wires.

In a further advantageous configuration it is provided that a printed circuit board extends laterally alongside the semiconductor chips in a manner at least partly surrounding said semiconductor chips, and in particular runs with conductor tracks below a ring reflector.

Further advantages, details and features emerge from the following description of two exemplary embodiments of the invention with reference to the drawing.

DETAILED DESCRIPTION

Figure 1:
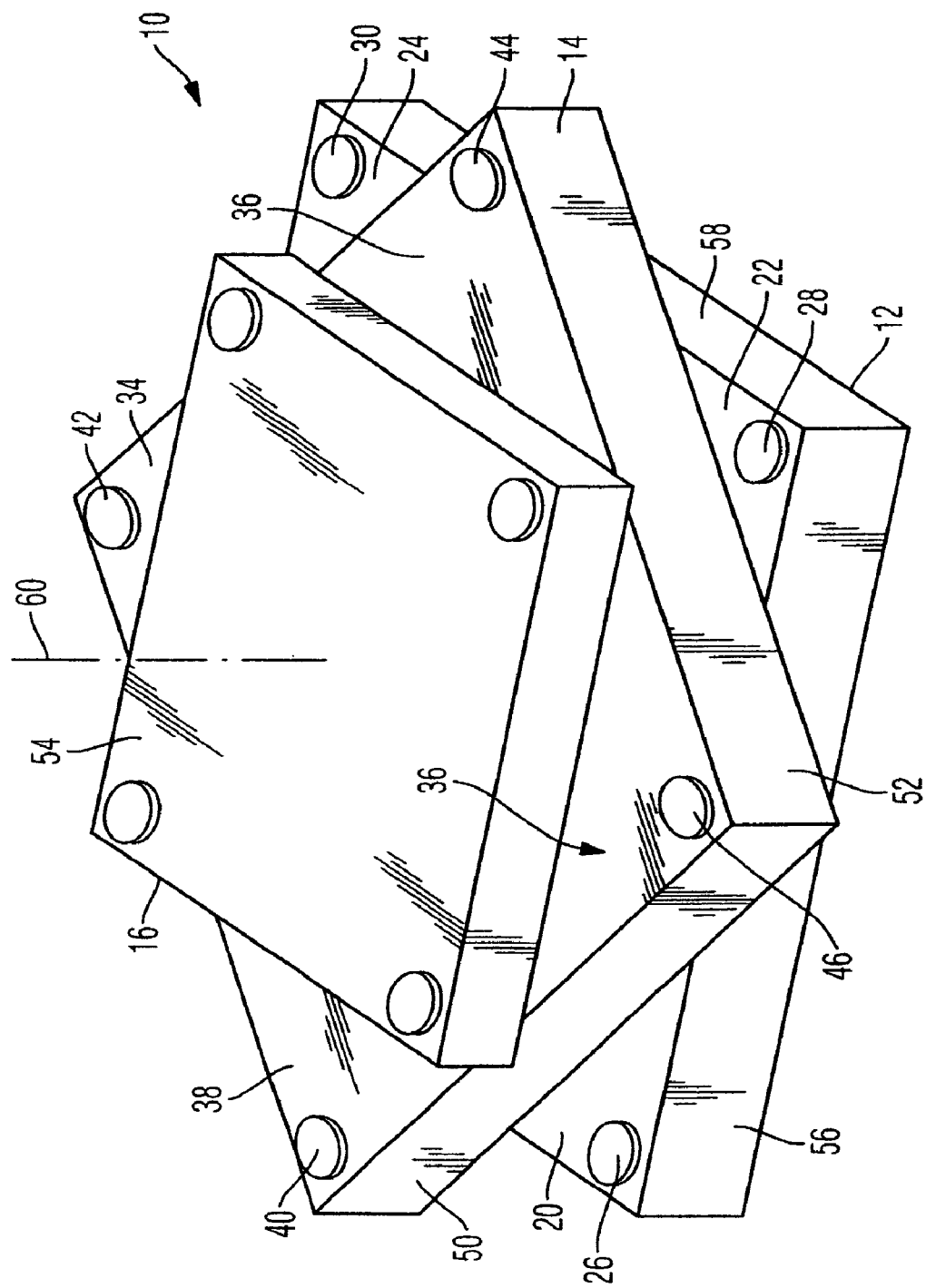
FIG. 1 shows a schematic view of one embodiment of a semiconductor radiation source according to the invention in a perspective illustration.

FIG. 1 reveals a light emission device 10 according to the invention in one embodiment. This light emission device 10 has a plurality of semiconductor chips, namely a lower semiconductor chip 12, a middle semiconductor chip 14 and an upper semiconductor chip 16. In this case, the lower semiconductor chip 12, which may also be referred to as first semiconductor chip, is fitted onto a substrate, which can be seen from FIG. 3 by way of example.

The substrate may be configured in any suitable manner. It preferably dissipates heat that is particularly preferably metallic. However, it is also possible, in a solution with lower power, to use a plastic casting material as substrate, which then fixes the spatial arrangement of the semiconductor chips.

In the exemplary embodiment illustrated, the first or lower semiconductor chip 12 is formed as a lamina having an essentially square parallelepiped form. Such semiconductor chips or LED chips are readily commercially available.

In the exemplary embodiment illustrated, the lower semiconductor chip 12 and the middle semiconductor chip 14 have the ratio between edge length and thickness of approximately 8:1. They are identical in size and placed one on top of another, but rotated relative to one another. The rotation is effected at an angle of approximately 45°, but a rotational angle of 30° or 60° would also readily be possible.

As a result of the rotation, the middle semiconductor chip 14 leaves four triangular areas as left-free areas, the areas 20, 22 and 24 being evident from FIG. 1. The area remaining there suffices to provide in each case an electrical connection area 26, 28 and 30, which are in each case provided on the very far outer part and in circular fashion and are prepared for bonding.

In the exemplary embodiment illustrated, four connection areas are provided per chip, and the chip carries a total of three structures which can be driven independently of one another and which emit light, with the result that any driving arrangements are possible. As an alternative, provision may also be made for providing only two structures which can then be electrically isolated from one another and are connected in each case to a pair of connection areas.

In the exemplary embodiment illustrated, the upper semiconductor chip 16 is smaller than the middle and lower semiconductor chips 14 and 12.

Its edge length/thickness ratio is likewise approximately 8:1, with the result that it is also thinner than the other two chips 12 and 14.

It is rotated once again by 45° relative to the middle semiconductor chip 14, with the result that it extends edge-parallel to the lower semiconductor chip 12. This arrangement gives rise to further left-free areas 32, 34, 36 and 38, which in each case have a triangular construction and also serve for contact-connection via corresponding connection areas 40, 42, 44 and 46.

The upper semiconductor chip 16 is of a size such that it covers a significant part of the middle semiconductor chip 14, for example 70% of its area.

The middle semiconductor chip 14 emits light on the one hand at its lateral emission areas, the emission areas 50 and 52 being evident from FIG. 1, and on the other hand at its underside, but also in large part at its top side.

The light emitted below the upper semiconductor chip 16 passes through the latter and in this respect amplifies the light emitted on the top side 54 of the upper semiconductor chip 16. In this case, it is possible expediently to make use of the fact that the thickness of the upper semiconductor chip 16 is somewhat smaller than that of the other two semiconductor chips 12 and 14; the attenuation when passing through the relevant chip 16 decreases as a result.

A corresponding light emission and passage behavior is also exhibited by the stacking of the middle semiconductor chip on the lower semiconductor chip 12. Accordingly, the light emitted from the top side of the lower semiconductor chip 12 passes through both the middle semiconductor chip 14 and the upper semiconductor chip 16 insofar as it is not emitted in the region of the areas 20 to 24.

In this case, too, light is additionally emitted at the lateral emission areas, the emission areas 56 and 58 being evident from FIG. 1.

Semiconductor chips having a spherical radiating characteristic are preferably used. The radiating characteristics of the light emission device formed from the three semiconductor chips 12, 14 and 16 essentially results as the computational summation of the emitted light intensities, considered over the angular deviation from the optical axis 60. This idealized radiating characteristic, which exhibits a behavior approximated to a lobe, is in practice attenuated by the radiation absorption of the light emission of the lower semiconductor chips by the upper semiconductor chips. In the case of material identity, however, the attenuation is surprisingly markedly low, which in particular is probably attributable to the matching of the lattice constants.

Figure 2:
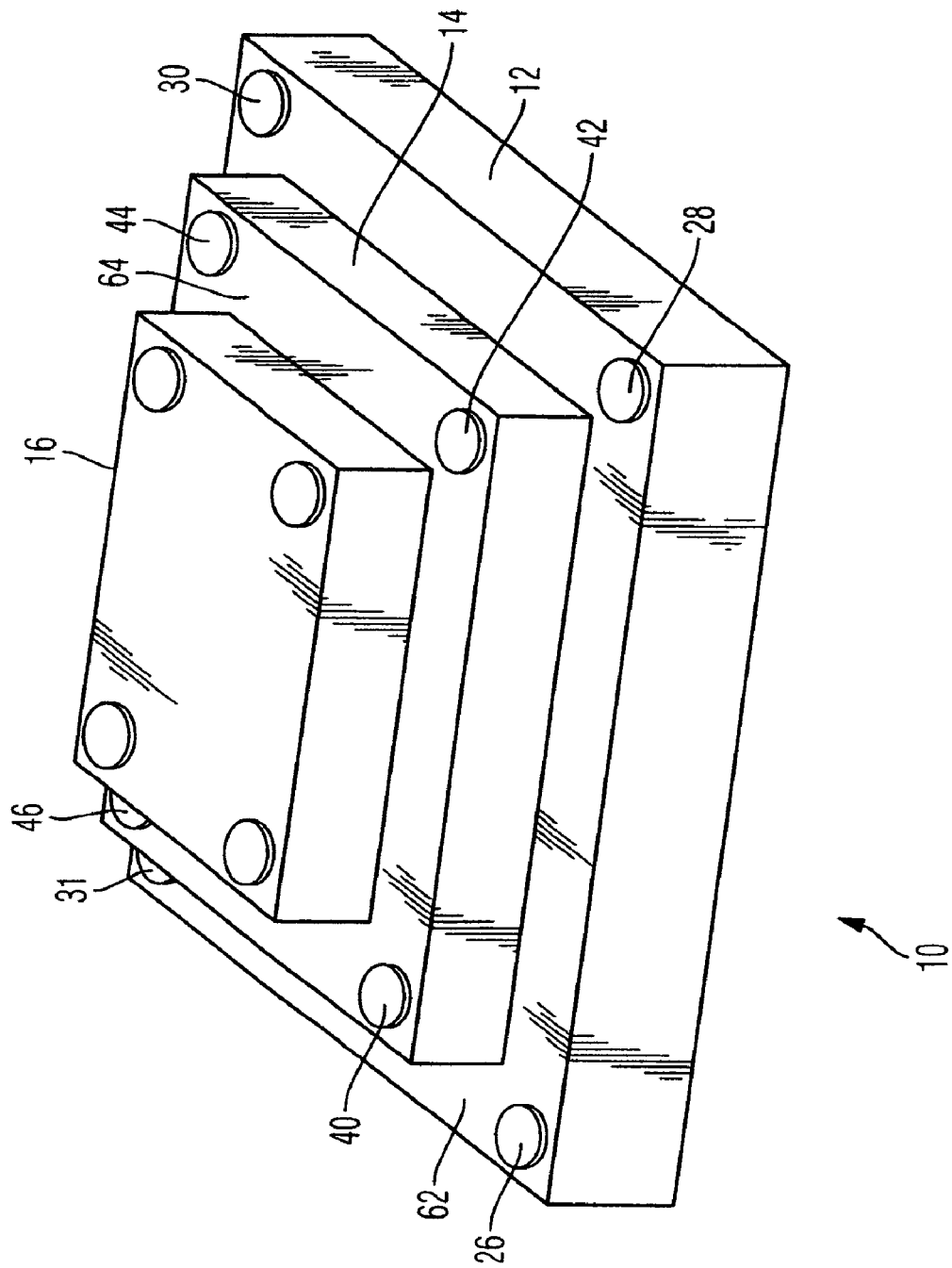
FIG. 2 shows a view corresponding to FIG. 1 of a further embodiment of a semiconductor radiation source according to the invention.

FIG. 2 reveals a modified embodiment of a light emission device 10 according to the invention. In FIG. 2 and also in the rest of the figures, identical reference symbols indicate identical or corresponding parts. In the case of the embodiment in accordance with FIG. 2, all the light conductor chips 12, 14 and 16 are constructed pyramidally with respect to one another. The semiconductor chip 12 is the largest and is fitted on the substrate in thermally conductively connected fashion. The middle semiconductor chip 14 is applied on said semiconductor chip 12, and it is smaller than the semiconductor chip 12.

The differences in dimensions give rise to a peripheral free edge 62, the width of which essentially corresponds to the thickness of the semiconductor chip 14. The connection areas 26, 28, 30 and 31 of the lower semiconductor chip 12 are again fitted in the corners, the same correspondingly also applying to the connection areas 40 to 46 of the middle semiconductor chip 14 and the connection areas of the upper semiconductor chip 16.

Since the upper semiconductor chip 16 is even smaller than the middle semiconductor chip 14 and is likewise fitted on the latter, there as well a peripheral edge 64 arises, the width of which in turn corresponds to the thickness of the semiconductor chip 16.

This arrangement and configuration results overall in a truncated pyramid having a pyramid angle of approximately 45°.

The chips 12 to 14 are each applied on one another in thermal contact. This can be realized by a very thin adhesive layer, for example, which additionally improves the heat transfer.

Figure 3:
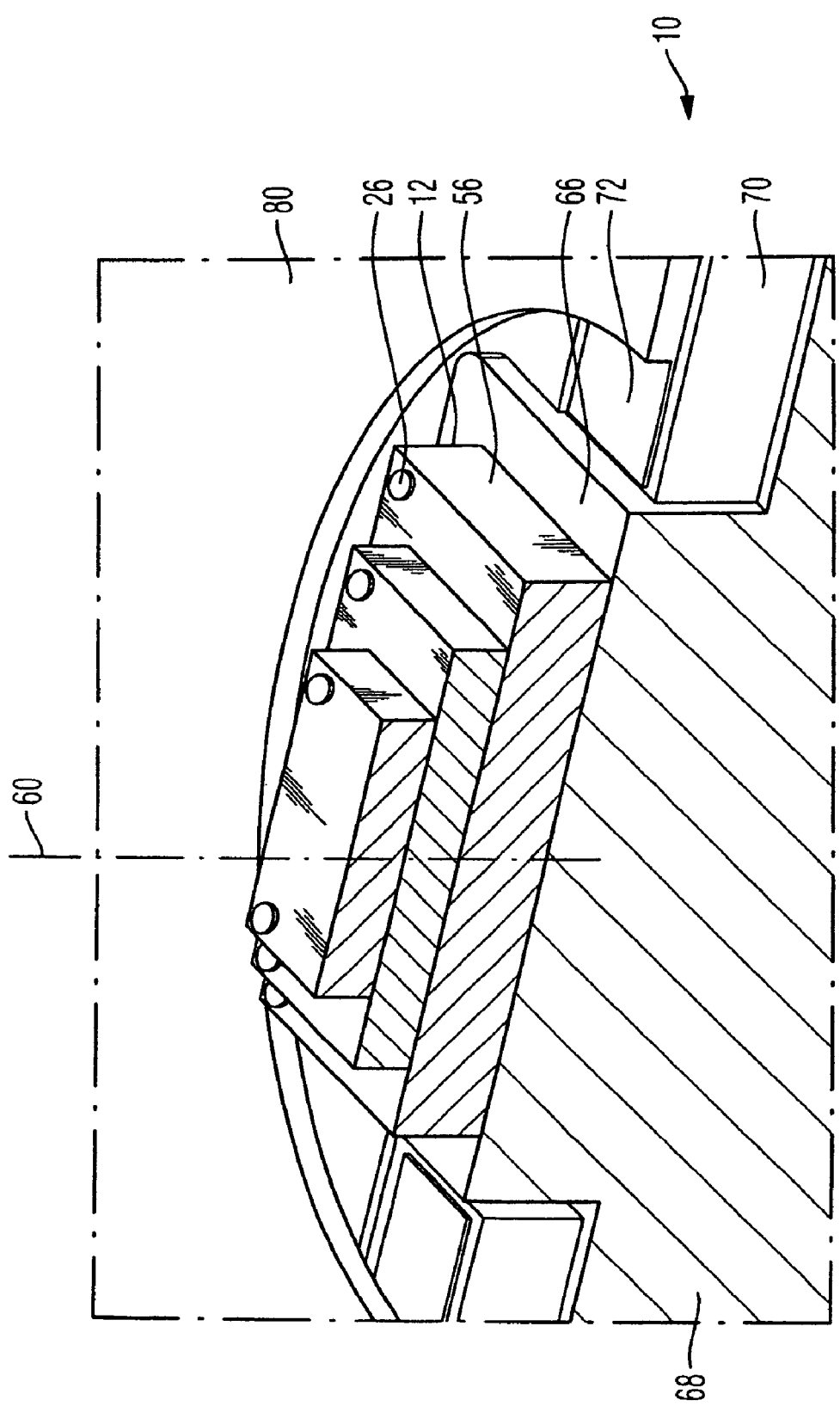
FIG. 3 shows a partly sectional, likewise perspective illustration of a semiconductor radiation source in the embodiment in accordance with FIG. 2, the illustration showing the embodiment in the installed state.

FIG. 3 reveals a corresponding light emission device 10 in a sectional state and in an installed state. The light emission device 10 is fitted on a substrate 66, which is composed of copper, for example, that has a base projection 68. The base projection 68 has larger dimensions than the lower semiconductor chip 12. It is adjoined by a printed circuit board 70 carrying free areas 72 of conductor tracks which serve for making contact with the various connection areas. By way of example, the connection area 28 can be connected to the free area 72 via the bonding wire (not illustrated)

Supported on the printed circuit board is a ring reflector 80 as an additional reflector, which annularly surrounds the light emission device. The ring reflector 80 has, in a manner known per Se, an inner area which faces obliquely inward and reflects light emerging from the lateral emission areas, for example the emission area 56, toward the front, that is to say in the direction of the optical axis 60.

A reflector is furthermore provided between the base projection 68 and the lower semiconductor chip 12, which reflector cannot be seen from the illustration in the drawing and likewise projects the light impinging there toward the front.

While a preferred form of this invention has been described above and shown in the accompanying drawings, it should be understood that applicant does not intend to be limited to the particular details described above and illustrated in the accompanying drawings, but intends to be limited only to the scope of the invention as defined by the following claims. In this regard, the term "means for" as used in the claims is intended to include not only the designs illustrated in the drawings of this application and the equivalent designs discussed in the text, but it is also intended to cover other equivalents now known to those skilled in the art, or those equivalents which may become known to those skilled in the art in the future.

What is claimed is:

1. A light emission device, comprising at least two light-emitting semiconductor chips and a substrate, wherein at least one first semiconductor chip (12) is fitted on the substrate (66) and a second semiconductor chip (14) is fitted on the first semiconductor chip (12), the emission device further including a third semiconductor chip (16) fitted on the second semiconductor chip (14), and wherein the second semiconductor chip (14) leaves free an upwardly facing area of the first semiconductor chip (12), and wherein at least the left-free area of the first semiconductor chip (12) and at least one area of the second semiconductor chip (14) are light-emitting, wherein the semiconductor chips (12, 14, 16) are connected to one another by means of a reflection-free adhesive layer having a thermal conductivity having approximately the same magnitude as the thermal conductivity of the semiconductor chips (12, 14, 16).

2. The light emission device as claimed in claim 1 wherein the first semiconductor chip (12) is applied to an electrically at least semiconducting substrate (66), and wherein an electrical connection area of the first semiconductor chip (12) is formed by the substrate.

3. The light emission device as claimed in claim 1, wherein lateral light emission areas (50, 52, 56, 58) extend laterally at the chips, which are offset with respect to one another.

4. The light emission device as claimed in claim 1, wherein a lateral light emission area (50, 52) of the second semiconductor chip (14) extends, relative to a lateral light emission area (56, 58) of the first semiconductor chip (12), in a manner shifted toward the center of the semiconductor chip (14).

5. The light emission device as claimed in claim 1, wherein the semiconductor chips (12, 14, 16) are constructed essentially pyramidally with respect to one another.

6. The light emission device as claimed in claim 1, the semiconductor chips (12, 14, 16) are at least partly transmissive to emitted radiation.

7. The light emission device as claimed in claim 1, wherein the light emission device has a reflector fitted below the first semiconductor chip (12), and wherein no reflector is provided between the first, a second and the third semiconductor chip (16).

8. The light emission device as claimed in claim 1, wherein a reflector is fitted below the first semiconductor chip (12), which extends laterally beyond the semiconductor chip.

9. The light emission device as claimed in claim 1, wherein the semiconductor chips (12, 14, 16) which emit light have different spectral wavelengths.

10. The light emission device as claimed in claim 1, wherein the semiconductor chips (12, 14, 16) are at least partly electrically connected in series with one another.

11. A light emission device, comprising at least two light-emitting semiconductor chips and a substrate, wherein at least one first semiconductor chip (12) is fitted on the substrate (66) and a second semiconductor chip (14) is fitted on the first semiconductor chip (12), the emission device further including a third semiconductor chip (16) fitted on the second semiconductor chip (14), and wherein the second semiconductor chip (14) leaves free an upwardly facing area of the first semiconductor chip (12), and wherein at least the left-free area of the first semiconductor chip (12) and at least one area of the second semiconductor chip (14) are light-emitting, wherein the semiconductor chips (12, 14, 16) are at least partly electrically connected in parallel with one another.

12. The light emission device as claimed in claim 1, wherein the semiconductor chips (12, 14, 16) have at least one electrical connection zone on their top side in the region of the left-free area.

13. The light emission device as claimed in claim 1, wherein the substrate (66) carries a reflection layer.

14. The light emission device as claimed in claim 1, wherein the third semiconductor chip (16) is smaller than the first semiconductor chip (12), the size difference corresponding approximately to twice the thickness of each semiconductor chip (12, 14, 16).

15. The light emission device as claimed in claim 1, wherein semiconductor chips (12, 14, 16) fitted one on top of another are rotated relative to one another at an angle of 45°.

16. The light emission device as claimed in claim 1, wherein the substrate has a projection, the dimensions of which essentially correspond to the dimensions of the first semiconductor chip (12) and on which the first semiconductor chip (12) is fitted.

17. The light emission device as claimed in claim 1, wherein a ring reflector (80) surrounds the semiconductor chips (12, 14, 16) fitted one on top of another, the orientation of which reflector is oblique or parabolic in a manner known per se and which reflector reflects the lateral light emission of the semiconductor chips (12, 14, 16) toward the front.

18. The light emission device as claimed in claim 1, wherein a printed circuit board is provided, which printed circuit board has free areas, and electrical connection areas (26, 28, 20) are adjacent to the free areas (20, 22, 24) to which areas they are electrically connected by means of bonding wires.

19. The light emission device as claimed in claim 18, wherein the printed circuit board extends laterally alongside the semiconductor chips (12, 14, 16) in a manner at least partly surrounding said semiconductor chips, and runs with conductor tracks below a ring reflector (80).

20. The light emission device as claimed in claim 1 wherein the thickness of the adhesive layer is less than 100 μm.

* * * * *